United States Patent
Morris, III et al.

(10) Patent No.: US 10,062,517 B2
(45) Date of Patent: Aug. 28, 2018

(54) MICRO-ELECTRO-MECHANICAL SYSTEM (MEMS) VARIABLE CAPACITOR APPARATUSES AND RELATED METHODS

(71) Applicant: wiSpry, Inc., Irvine, CA (US)

(72) Inventors: Arthur S. Morris, III, Raleigh, NC (US); Dana DeReus, Santa Ana, CA (US); Norito Baytan, Riverside, CA (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 15/374,719

(22) Filed: Dec. 9, 2016

(65) Prior Publication Data

US 2017/0154734 A1    Jun. 1, 2017

Related U.S. Application Data

(62) Division of application No. 14/033,434, filed on Sep. 20, 2013.
(Continued)

(51) Int. Cl.
*H01G 5/16* (2006.01)
*B81C 1/00* (2006.01)
(Continued)

(52) U.S. Cl.
CPC .......... *H01G 5/16* (2013.01); *B81B 3/0051* (2013.01); *B81C 1/00166* (2013.01);
(Continued)

(58) Field of Classification Search
CPC ... H01G 5/16; H01G 5/18; H01G 7/00; B81C 1/00166; B81C 1/00476;
(Continued)

(56) References Cited

U.S. PATENT DOCUMENTS 6,229,684 B1    5/2001    Cowen
6,362,018 B1    3/2002    Xu
(Continued)

FOREIGN PATENT DOCUMENTS

CN    1529890 A    9/2004
EP    2898519    7/2015
(Continued)

OTHER PUBLICATIONS

International Search Report and Written Opinion for Application No. PCT/US2013/061065 dated Dec. 23, 2013.
(Continued)

*Primary Examiner* — Anita K Alanko
(74) *Attorney, Agent, or Firm* — Jenkins, Wilson, Taylor & Hurt, P.A.

(57) ABSTRACT

Systems, devices, and methods for micro-electro-mechanical system (MEMS) tunable capacitors can include a fixed actuation electrode attached to a substrate, a fixed capacitive electrode attached to the substrate, and a movable component positioned above the substrate and movable with respect to the fixed actuation electrode and the fixed capacitive electrode. The movable component can include a movable actuation electrode positioned above the fixed actuation electrode and a movable capacitive electrode positioned above the fixed capacitive electrode. At least a portion of the movable capacitive electrode can be spaced apart from the fixed capacitive electrode by a first gap, and the movable actuation electrode can be spaced apart from the fixed actuation electrode by a second gap that is larger than the first gap.

5 Claims, 12 Drawing Sheets

Related U.S. Application Data

(60) Provisional application No. 61/703,595, filed on Sep. 20, 2012.

(51) Int. Cl.
*B81B 3/00* (2006.01)
*H01G 7/00* (2006.01)
*H01G 5/18* (2006.01)

(52) U.S. Cl.
CPC ........ *B81C 1/00476* (2013.01); *B81B 3/0008* (2013.01); *B81B 3/0016* (2013.01); *B81B 2201/0221* (2013.01); *B81C 2201/013* (2013.01); *B81C 2201/0109* (2013.01); *H01G 5/18* (2013.01); *H01G 7/00* (2013.01)

(58) Field of Classification Search
CPC ...... B81C 2201/0109; B81C 2201/013; B81C 2201/0221; B81B 3/0008; B81B 3/0016; B81B 3/0051
See application file for complete search history.

(56) References Cited

U.S. PATENT DOCUMENTS

| | | | |
|---|---|---|---|
| 7,027,284 B2 | 4/2006 | Kobayashi et al. | |
| 7,141,989 B1 | 11/2006 | Liu | |
| 7,440,254 B2 | 10/2008 | Gallant | |
| 2002/0005341 A1 | 1/2002 | Seki | |
| 2002/0018334 A1 | 2/2002 | Hill | |
| 2002/0074621 A1 | 6/2002 | Cheng | |
| 2004/0173876 A1* | 9/2004 | Musalem | H01G 5/04 257/595 |
| 2004/0222074 A1 | 11/2004 | Bouche et al. | |
| 2006/0098266 A1 | 5/2006 | Payne et al. | |
| 2006/0152111 A1 | 7/2006 | Allison et al. | |
| 2009/0134492 A1* | 5/2009 | Morris, III | B81C 1/00095 257/532 |
| 2010/0214716 A1 | 8/2010 | Liu et al. | |
| 2010/0240215 A1* | 9/2010 | Huang | B81C 1/0015 438/669 |
| 2012/0055769 A1 | 3/2012 | Naito | |
| 2014/0211366 A1 | 7/2014 | Morris, III | |

FOREIGN PATENT DOCUMENTS

| | | |
|---|---|---|
| JP | 2012 178379 A | 11/2012 |
| WO | WO 2014/047525 | 3/2014 |

OTHER PUBLICATIONS

Restriction Requirement for U.S. Appl. No. 14/033,434 dated Jun. 17, 2015.
Non-Final Office Action for U.S. Appl. No. 14/033,434 dated Nov. 24, 2015.
Extended European Search Report for Application No. 13839408.5 dated May 3, 2016.
International Preliminary Report on Patentability for Application No. PCT/US2013/061065 dated Mar. 24, 2015.
Communication of European Publication No. and Information for Application No. 13839408 dated Jul. 1, 2015.
Notice of Allowance for U.S. Appl. No. 14/033,434 dated Jun. 29, 2016.
Chinese Office Action for Application No. 2013800607198 dated Nov. 28, 2016.
Non-Final Office Action for U.S. Appl. No. 14/033,434 dated Jan. 13, 2017.
Chinese Office Action for Application No. 2013800607198 dated Jul. 12, 2017.
Final Office Action for U.S. Appl. No. 14/033,434 dated Aug. 29, 2017.
Interview Summary for U.S. Appl. No. 14/033,434 dated Nov. 28, 2017.
Chinese Notice of Allowance for Chinese Application No. 2013800607198 dated Dec. 13, 2017.
Advisory Action with AFCP 2.0 Decision for U.S. Appl. No. 14/033,434 dated Dec. 15, 2017.
Non-Final Office Action for U.S. Appl. No. 14/033,434 dated Mar. 22, 2018.

* cited by examiner

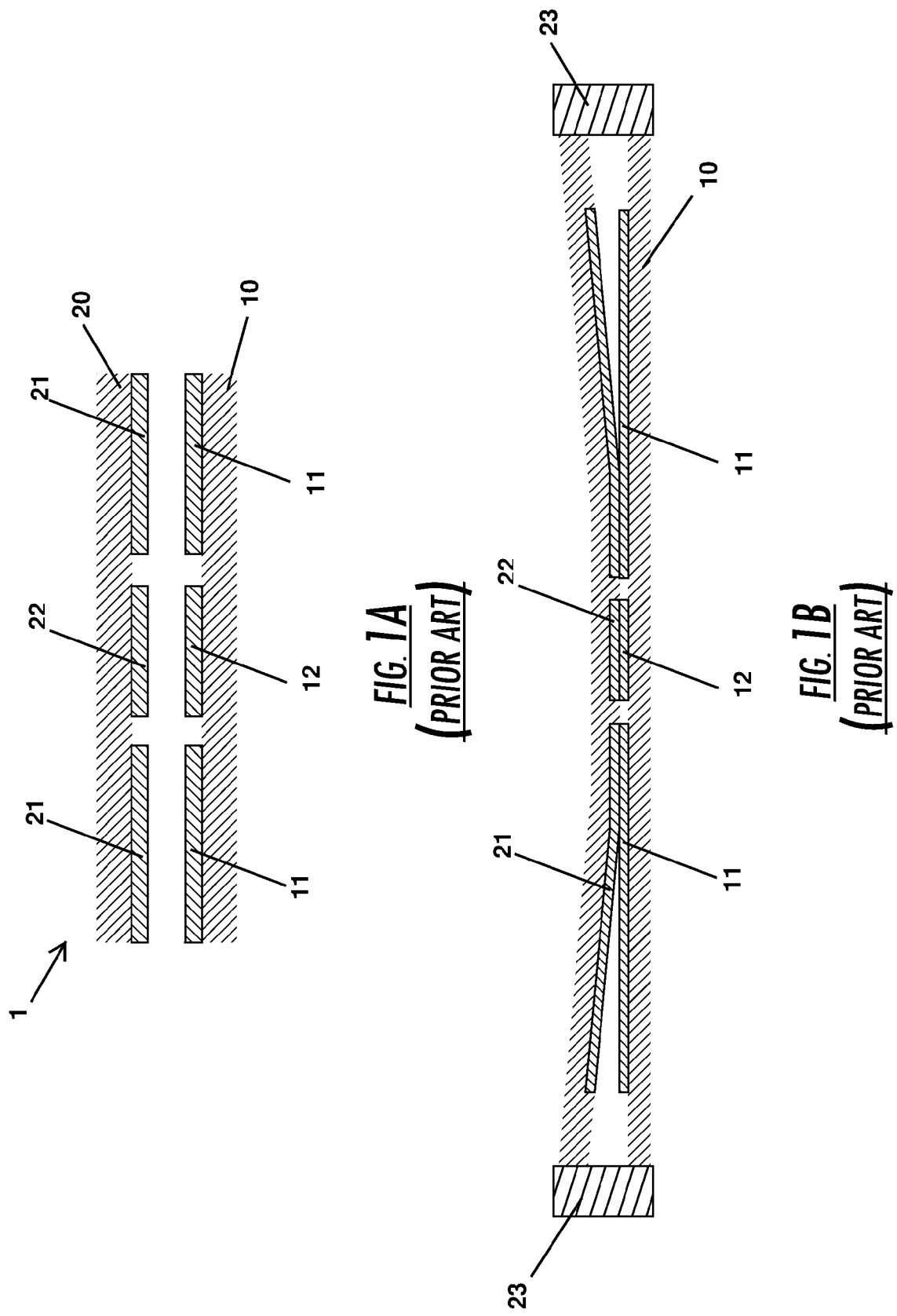

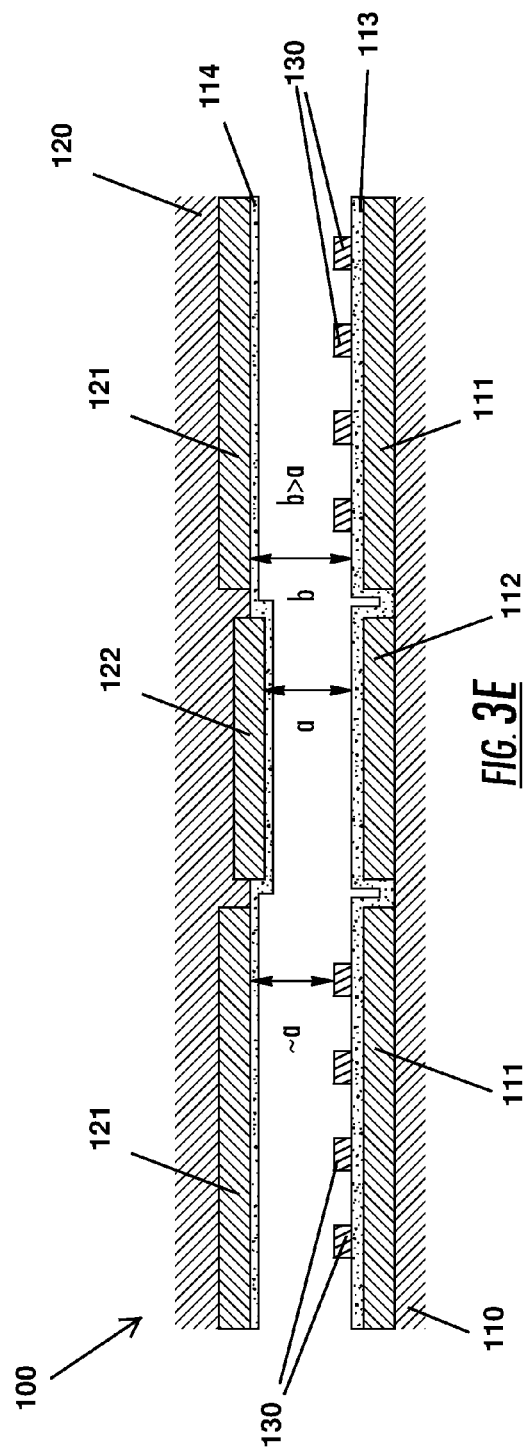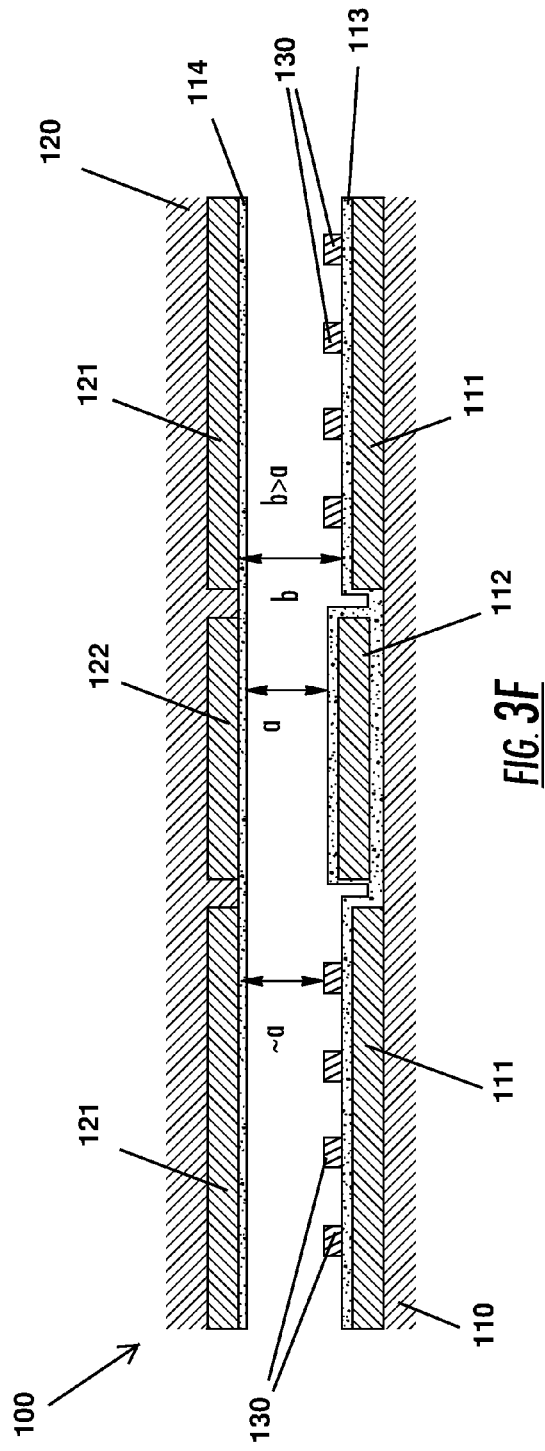

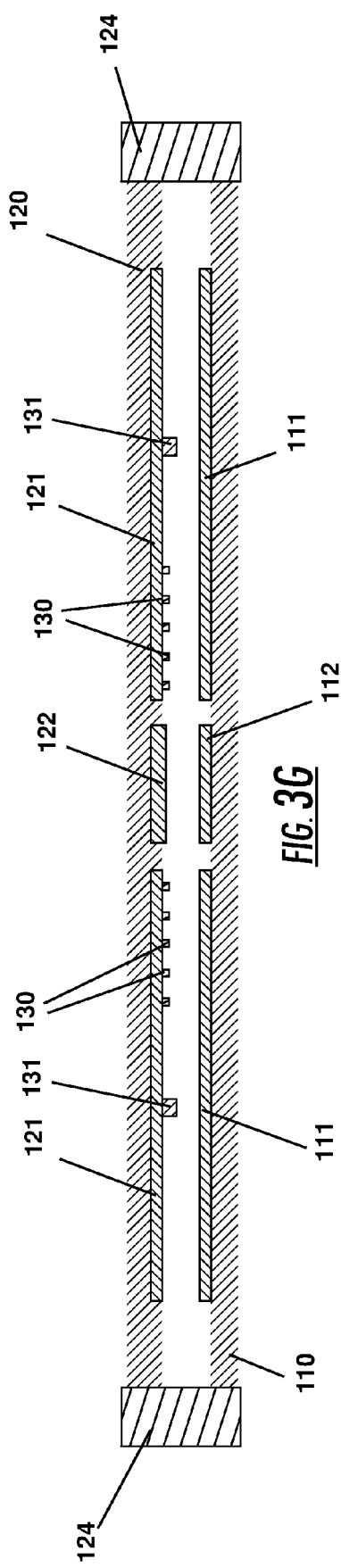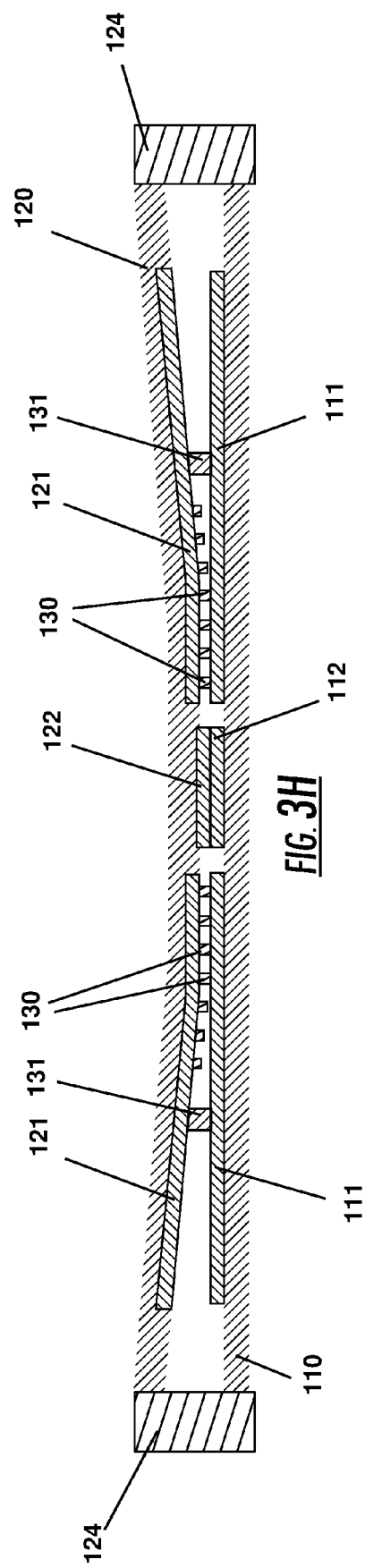

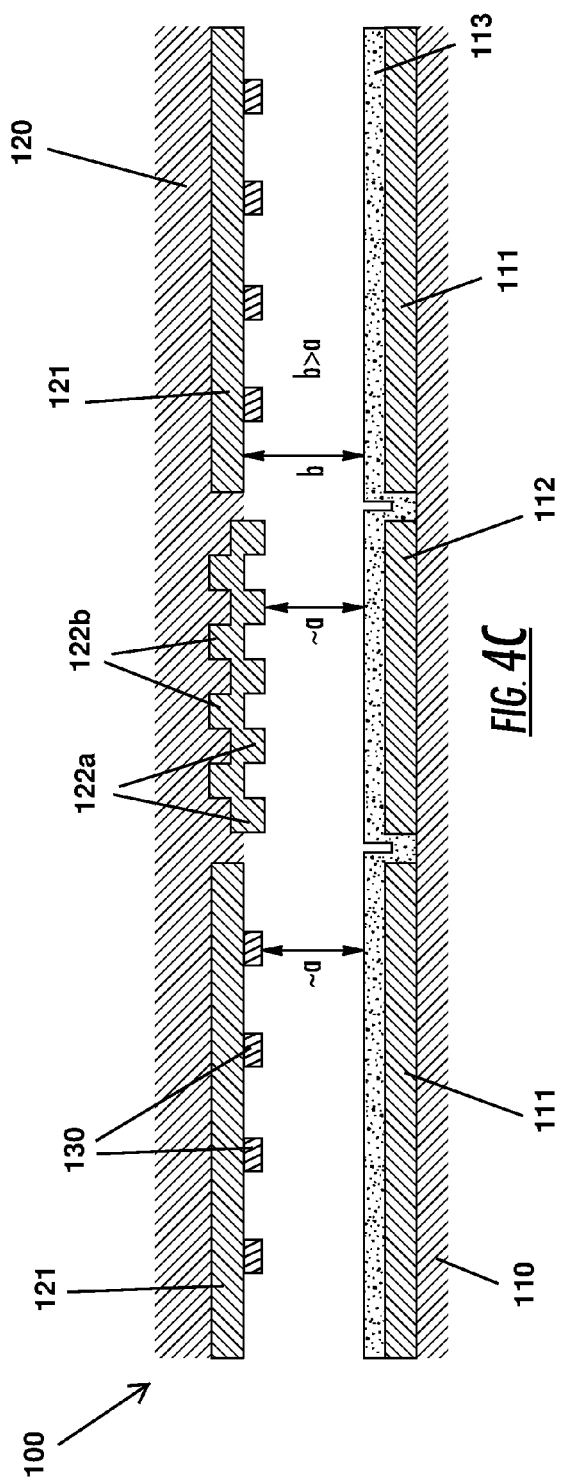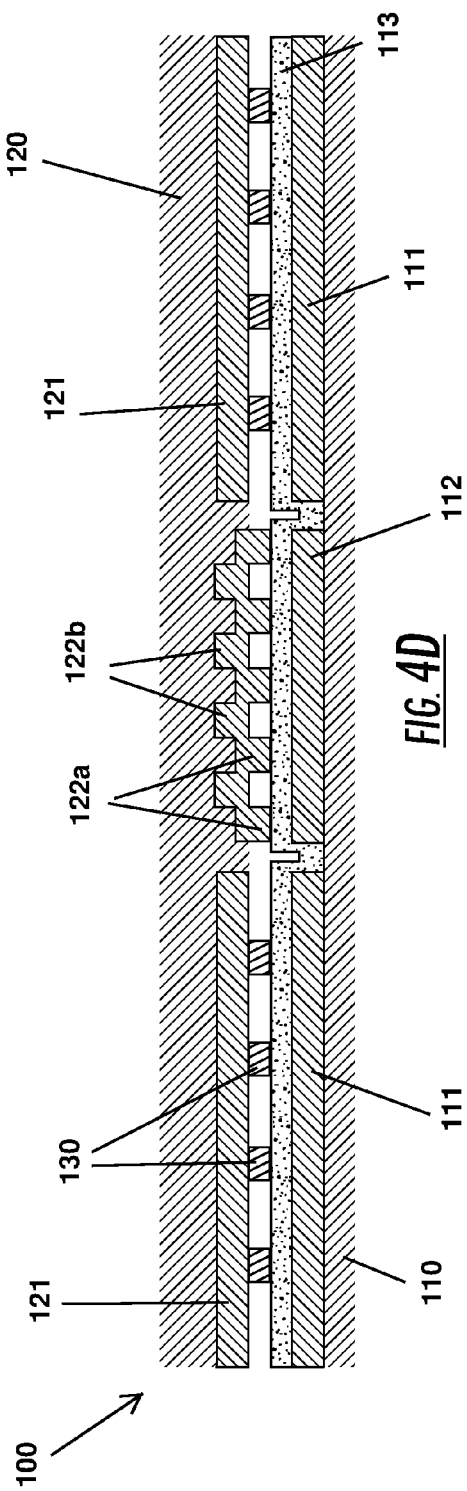

MICRO-ELECTRO-MECHANICAL SYSTEM (MEMS) VARIABLE CAPACITOR APPARATUSES AND RELATED METHODS

PRIORITY CLAIM

This application is a divisional of and claims priority to U.S. patent application Ser. No. 14/033,434 filed Sep. 20, 2013 which claims the benefit of U.S. Provisional Patent Application Ser. No. 61/703,595, filed Sep. 20, 2012, the disclosure of which is incorporated herein by reference in its entirety.

TECHNICAL FIELD

The subject matter disclosed herein relates generally to micro-electro-mechanical system (MEMS) devices and methods for the fabrication thereof. More particularly, the subject matter disclosed herein relates to systems, devices, and methods for MEMS variable capacitors.

BACKGROUND

Micro-electro-mechanical systems (MEMS) can be used to create variable capacitors. Specifically, for example, as shown in FIG. 1a, a variable capacitor 1 can include a substrate 10 on which one or more fixed actuation electrodes 11 and one or more fixed capacitive electrodes 12 can be positioned. A movable component 20 can be suspended above substrate 10, movable component 20 being fixed with respect to substrate 10 at either end. Movable component 20 can include one or more movable actuation electrodes 21 and one or more movable capacitive electrodes 22. In this configuration, by controlling a potential difference between fixed actuation electrodes 11 and movable actuation electrodes 21, movable component 20 can be selectively moved toward or away from substrate 10. In this way, the capacitance between fixed capacitive electrode 12 and movable capacitive electrode 22 can be selectively varied. In some aspects, a layer of dielectric material can be deposited to cover the actuation electrode 11 and capactive electrode 12. The dielectric material can be planarized to provide a flat surface.

In some aspects, the substrate 10 and moveable component can be fixed by two anchor or support structures 23 on both ends as illustrated in FIG. 1B. In such configuration, however, applying a potential difference between fixed actuation electrodes 11 and movable actuation electrodes 21 can cause movable component 20 to flex toward substrate 10 unevenly, which can cause issues with charging in the actuator dielectric and wear. Furthermore, although it is desirable for movable capacitive electrode 22 to be able to move fully downward so that it can contact fixed capacitive electrode 12 to maximize the capacitance range, it can be undesirable for fixed actuation electrodes 11 and movable actuation electrodes 21 to get too close to one another since the electrodes can be subject to suddenly "snapping down" together after moving close enough to one another, as illustrated in FIG. 1B, and the device can suffer from dielectric damages and stiction caused by high electric fields between the actuator electrode for spacings that are too close.

Accordingly, it would be desirable for systems, devices, and methods for MEMS variable capacitors to more consistently bring its capacitor electrodes into close proximity while maintaining sufficient spacing of the adjacent actuator (s).

SUMMARY

In accordance with this disclosure, systems, devices, and methods for micro-electro-mechanical system (MEMS) tunable capacitors are provided. In one aspect, a MEMS variable capacitor is provided having a fixed actuation electrode attached to a substrate, a fixed capacitive electrode attached to the substrate, and a movable component positioned above the substrate and movable with respect to the fixed actuation electrode and the fixed capacitive electrode. The movable component can include a movable actuation electrode positioned above the fixed actuation electrode and a movable capacitive electrode positioned above the fixed capacitive electrode. At least a portion of the movable capacitive electrode can be spaced apart from the fixed capacitive electrode by a first gap, and the movable actuation electrode can be spaced apart from the fixed actuation electrode by a second gap that is larger than the first gap.

In some aspects, a MEMS variable capacitor can include a fixed capacitive electrode attached to a substrate, a first fixed actuation electrode and a second fixed actuation electrode attached to the substrate on opposing sides of the fixed capacitive electrode, and a movable component comprising a first end that can be fixed with respect to the substrate and a second end opposite the first end that can be fixed with respect to the substrate, a center portion of the movable component being positioned above the substrate and movable with respect to the fixed capacitive electrode, the first fixed actuation electrode, and the second fixed actuation electrode. The movable component can include a first movable actuation electrode positioned above the first fixed actuation electrode, a second movable actuation electrode positioned above the second fixed actuation electrode, and a movable capacitive electrode positioned above the fixed capacitive electrode. At least a portion of the movable capacitive electrode can be spaced apart from the fixed capacitive electrode by a first gap, and wherein the first movable actuation electrode and the second movable actuation electrode can be spaced apart from the first fixed actuation electrode and the second fixed actuation electrode, respectively, by a second gap that is larger than the first gap.

In another aspect, a method for manufacturing a MEMS variable capacitor is provided. The method can include depositing a fixed actuation electrode on a substrate, depositing a fixed capacitive electrode on the substrate, depositing a sacrificial layer over the fixed actuation electrode and the fixed capacitive electrode, etching the sacrificial layer to form a recess in a region of the sacrificial layer above the fixed capacitive electrode, depositing a movable actuation electrode on the sacrificial layer above the fixed actuation electrode, depositing a movable capacitive electrode in the recess of the sacrificial layer above the fixed capacitive electrode, depositing a structural material layer on the movable actuation electrode and the movable capacitive electrode, and removing the sacrificial layer such that the movable actuation electrode, the movable capacitive electrode, and the structural material layer define a movable component suspended above the substrate and movable with respect to the fixed actuation electrode and the fixed capacitive electrode. At least a portion of the movable capacitive electrode can be spaced apart from the fixed capacitive electrode by a first gap, and the movable actuation electrode can be spaced apart from the fixed actuation electrode by a second gap that is larger than the first gap.

In yet another aspect, a micro-electro-mechanical system (MEMS) variable capacitor can include a fixed actuation electrode attached to a substrate, a fixed capacitive electrode attached to the substrate, and a movable component positioned above the substrate and movable with respect to the fixed actuation electrode and the fixed capacitive electrode. The movable component can include a movable actuation electrode positioned above the fixed actuation electrode, a movable capacitive electrode positioned above the fixed capacitive electrode, and at least one standoff bump attached to the movable component at or near the movable actuation electrode. Where at least a portion of the movable capacitive electrode can be spaced apart from the fixed capacitive electrode by a first gap. Furthermore, the movable actuation electrode can be spaced apart from the fixed actuation electrode by a second gap that is larger than the first gap, and the at least one standoff bump can protrude from the movable actuation electrode a distance that is substantially equal to the difference between the dimensions of the first gap and the second gap.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIGS. 1A through 1D are side views of conventional variable capacitor configurations;

FIGS. 3A through 3H are side views of various variable capacitor configurations according to an embodiment of the presently disclosed subject matter;

FIGS. 4A through 4D are side views of various variable capacitor configuration according to an embodiment of the presently disclosed subject matter;

DETAILED DESCRIPTION

The present subject matter provides systems, devices, and methods for MEMS variable capacitors. In one aspect, the present subject matter provides configurations for MEMS variable capacitors that exhibit improved cycling lifetimes, allow improved capacitor contact, enable a snap pull-in characteristic that can be desirable for stable two-state operation, and reduce actuator stiction, contact forces, charging, breakdown, cycling, and/or hold down. To achieve these benefits, a MEMS variable capacitor can be configured to have different gap distances between the capacitor electrodes compared to the actuator electrodes. In such a configuration, the capacitor electrodes can be brought together while maintaining the actuator electrodes at desirable distances apart.

Figure 1C:
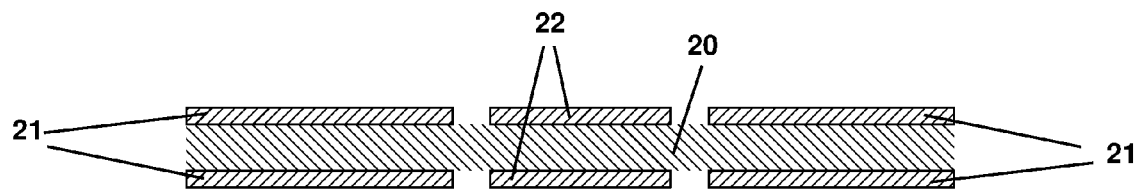
Figure 1D:
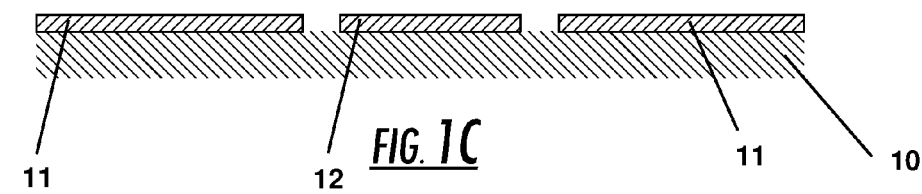

In some aspects, as illustrated in FIG. 1C, the movable component 20 can have additional actuation 21 and/or capacitive 22 electrodes on its top surface. This may form a mechanical structure that is balanced in stress and over temperature leading to a stable beam shape in fabrication and in operation. Electrical current can be connected to the electrodes located on the top surface and this can contribute to lower resistive losses and a more robust movable component 20 under high current conditions. In some other aspects, the entire movable component 20 can be made out of metal, as illustrated in FIG. 1D. According to this particular setup, a shunt capacitor can be constructed by coupling the actuation electrodes 11 and capacitive electrode 12 to a grounded moveable component 20.

Figure 2A:
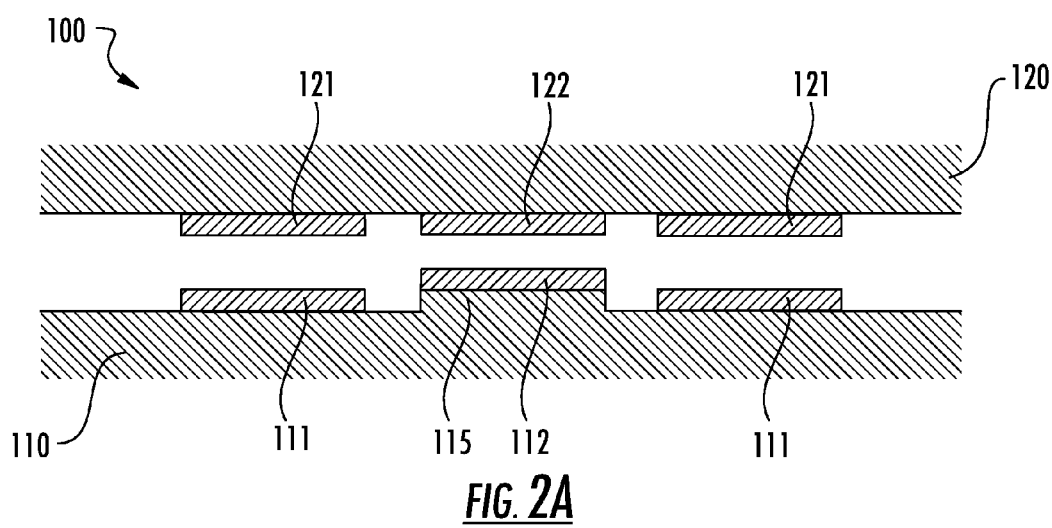
FIGS. 2A through 2H are side views of variable capacitor configurations according to various embodiments of the presently disclosed subject matter.

Furthermore, FIGS. 2A through 2H illustrate a variety of variable capacitor configuration that each decouple the dimensions of the air gaps between the capacitor plates and the actuator plates. As shown in FIG. 2a, for instance, for a variable capacitor, generally designated 100, a substrate 110 can include one or more fixed actuation electrodes 111 and at least one fixed capacitive electrode 112 positioned thereon. A movable component 120 can be suspended above substrate 110 and include one or more movable actuation electrodes 121 and at least one movable capacitive electrode 122. Movable component 120 can comprise a first end that is fixed with respect to substrate 110 and a second end opposite the first end that is fixed with respect to substrate 110. In this way, movable capacitive electrode 122 can be movable in a direction substantially perpendicular to a surface of substrate 110 to which fixed capacitive electrode 112 is attached.

Rather than fixed actuation electrodes 111 and fixed capacitive electrode 112 being arranged coplanar as in FIG. 1D, fixed capacitive electrode 112 can be raised above the surface of substrate 110 relative to fixed actuation electrodes 111). To accomplish this offset, an insulating pedestal 115 (e.g., an oxide material layer) is provided on substrate 110 prior to fixed capacitive electrode 112 being positioned over substrate 110. In some other aspects, this can be accomplished by depositing metal over the pedestal 115 and patterning the metal layer. In this configuration, movable capacitive electrode 122 is spaced apart from fixed capacitive electrode 112 by a first gap, and movable actuation electrodes 121 are spaced apart from fixed actuation electrodes 111 by a second gap that is larger than the first gap. In this way, movable capacitive electrode 122 can be moved into close proximity with fixed capacitive electrode 112 while maintaining a desired distance between movable actuation electrodes 121 and fixed actuation electrodes 111.

Figure 2B:
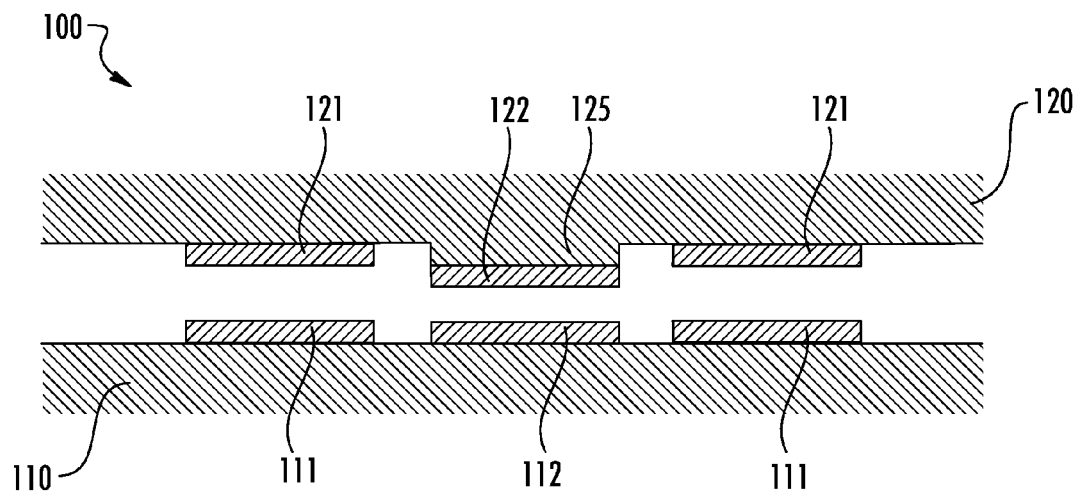

Similarly, in an alternative configuration shown in FIG. 2b, for example, a protrusion 125 can be provided between movable component 120 and movable capacitive electrode 122. In this way, movable capacitive electrode 122 can be offset toward fixed capacitive electrode 112 with respect to movable actuation electrodes 121.

Figure 2C:
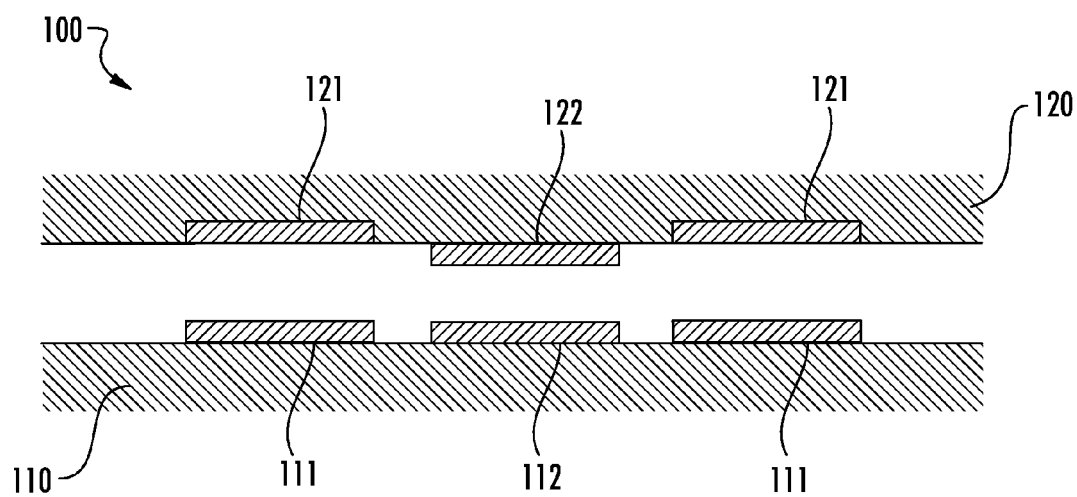

In yet a further alternative configuration shown in FIG. 2c, for example, movable actuation electrodes 121 can be at least partially embedded in movable component 120. For example, in a process for manufacturing variable capacitor 100, fixed actuation electrodes 111 and fixed capacitive electrodes 112 can be deposited or otherwise attached to substrate 110. A sacrificial layer can be provided over fixed actuation electrodes 111 and fixed capacitive electrode 112, and the sacrificial layer can be etched to form a recess in a region of the sacrificial layer above fixed capacitive electrode 111. Movable actuation electrodes 121 can be provided on the sacrificial layer above fixed actuation electrodes 111, and movable capacitive electrode 122 can be provided in the recess of the sacrificial layer above fixed capacitive electrode 112. Movable component 120 can be formed by providing a structural material layer on movable actuation electrodes 121 and movable capacitive electrode 122. The sacrificial layer can be removed such that movable actuation electrodes 121, movable capacitive electrode 122, and the structural material layer define movable component 120 suspended above substrate 110 and movable with respect to fixed actuation electrodes 111 and fixed capacitive electrode 112.

Figure 2D:
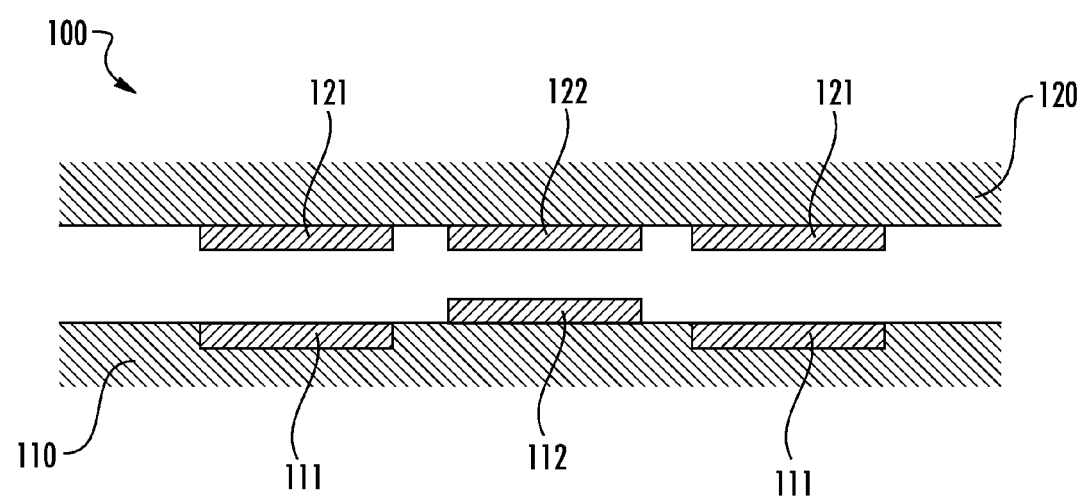

In still a further alternative configuration shown in FIG. 2d, for example, fixed actuation electrodes 111 can be at least partially embedded in substrate 110. In addition, although FIGS. 2a through 2d each only show one mechanism by which the first gap between movable capacitive electrode 122 and fixed capacitive electrode 112 is reduced relative to the second gap between movable actuation electrodes 121 and fixed actuation electrodes 111, those having skill in the art should recognize that the different ways of offsetting the capacitive electrodes with respect to the actuation electrodes can be combined in any of a variety of ways to further define the differentiation in gap sizes.

Figure 2E:
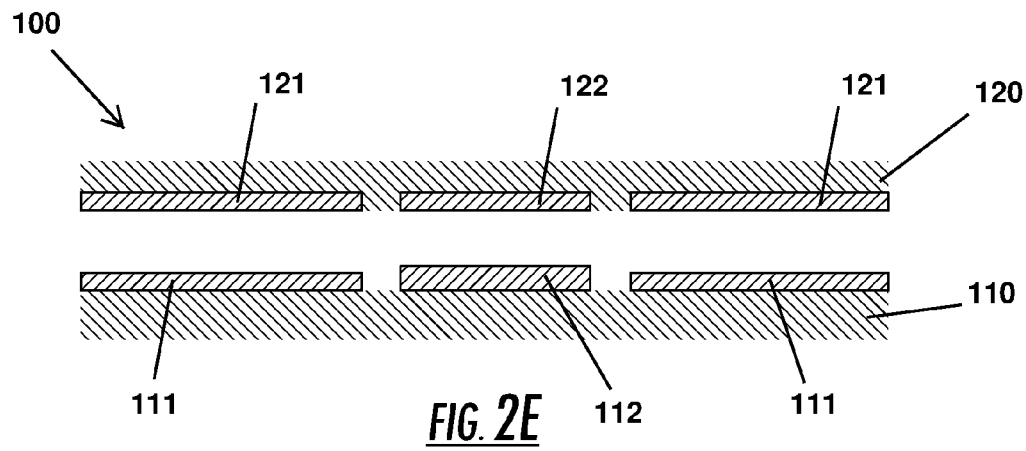

In some aspects, the fixed capacitive electrode 112 can be made thicker than the fixed actuation electrodes 111, as illustrated in FIG. 2E. In this way, movable capacitive electrode 122 can be offset toward fixed capacitive electrode 112 with respect to movable actuation electrodes 121.

Figure 2F:
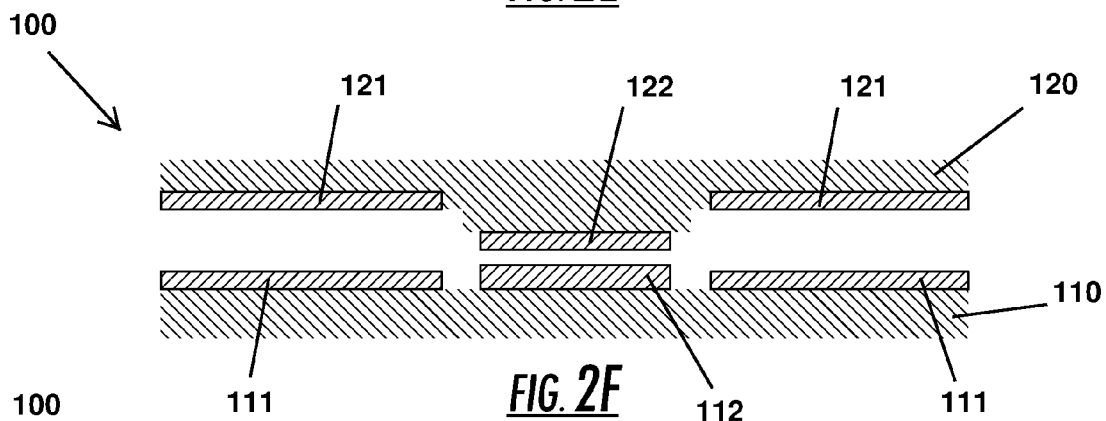
Figure 2G:
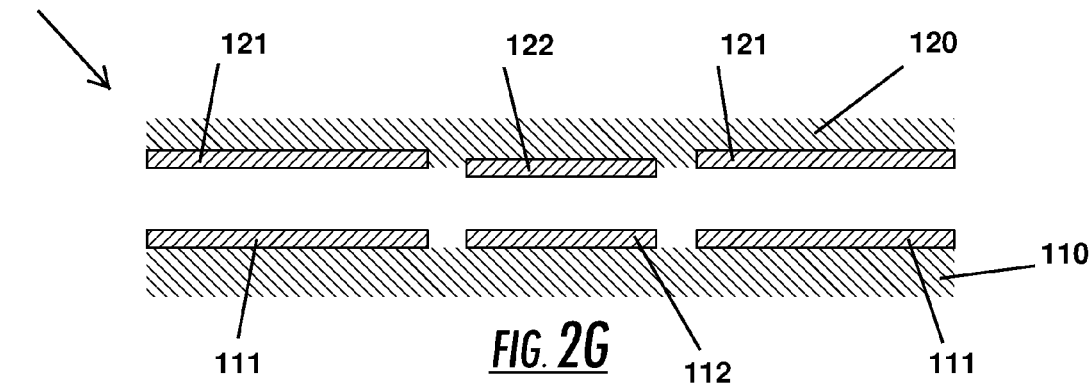

In some aspects, the movable capacitive electrode 122 can be placed closer or further to the fixed capacitive electrode 112 depending on the deposition depth of the electrode metal and the depth of the recess etched on the movable component 120. For example, FIG. 2C illustrates a setup where the depth of the recess is equal to the depth of the metal deposited. Otherwise, as illustrated in FIG. 2F, the depth of the recess can be deeper than the depth of the metal deposited, and the movable capacitive electrode 122 can be placed closer to the fixed capacitive electrode 112. The thickness of the electrode 112 can be taller than or equal to the thickness of the electrodes 111. Similarly, as illustrated in FIG. 2G, sometimes the depth of the recess can be shallower than the depth of the deposited metal, and the movable capacitive electrode 122 can appear to be semi-embedded into the movable component 120, and placed further away from the fixed capacitive electrode 112.

Figure 2H:
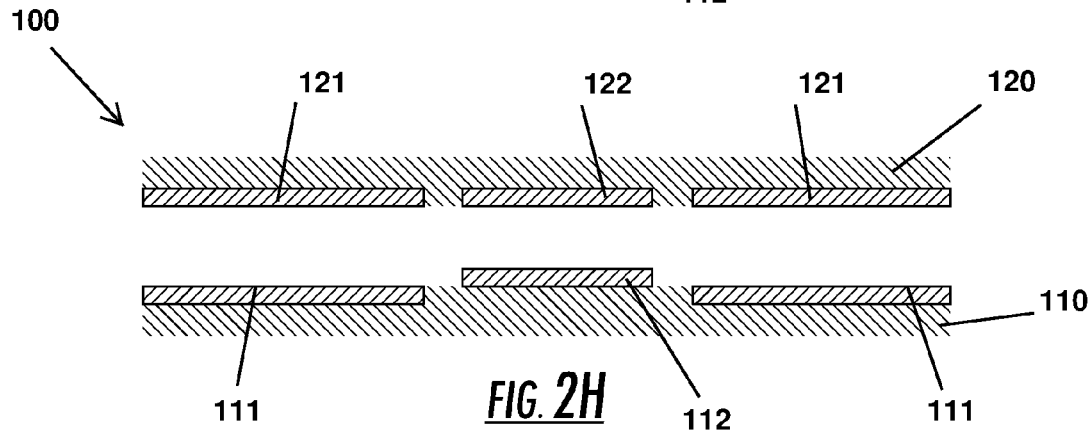

Alternatively, movable actuation electrodes 121 and capactive electrodes 122 can all be deposited on top a sacrificial layer, resulting in the movable electrodes being embedded in the movable component 120 as illustrated in FIG. 2H. in addition, fixed actuation electrodes 111 can be embedded in the substrate 110 via a, for example, etch and metal deposition sequence. As such, a larger gap can be created between the fixed actuation electrodes 111 and movable actuation electrodes 121.

Figure 3A:
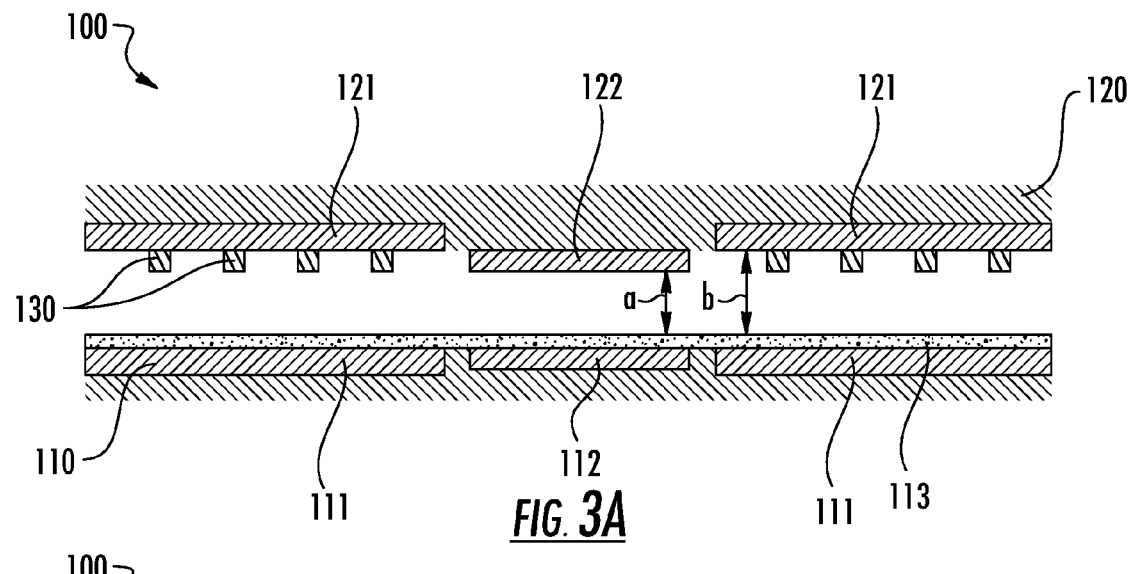
Figure 3B:
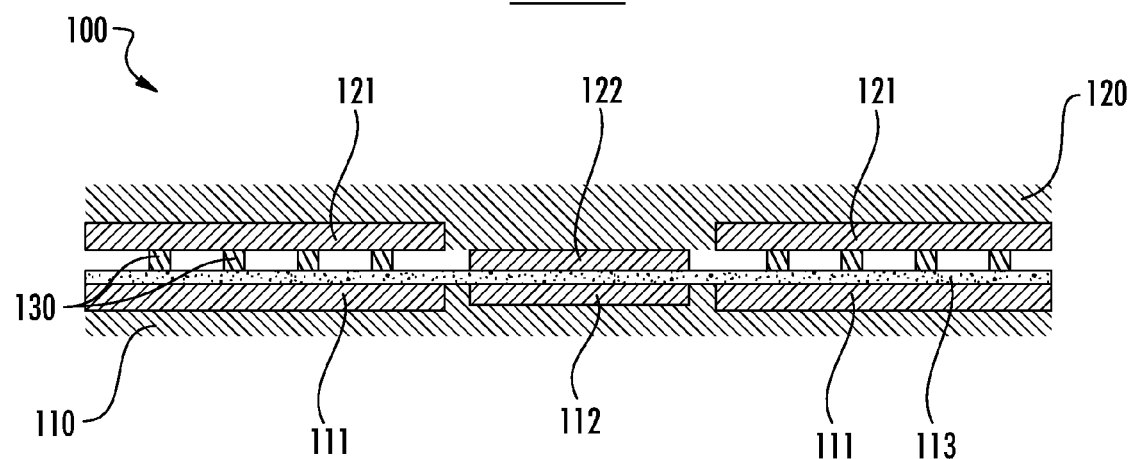

In addition to configuring the relative gap sizes, variable capacitor 100 can further include additional features that can help to improve cycling lifetimes, improve capacitor contact, enable a snap pull-in characteristic, and reduce actuator stiction, contact forces, charging, breakdown, cycling, and/or hold down. In particular, for example, as shown in FIGS. 3a and 3b, a thin dielectric layer 113 can be provided over fixed actuation electrodes 111 and fixed capacitive electrode 112 to help reduce contact forces between the elements in the "closed" state, to prevent shorting of the capacitor and to provide a more stable capacitance. In addition, at least one standoff bump 130 can be attached to movable component 120 at or near movable actuation electrodes 121. At least one standoff bump 130 can protrude from movable actuation electrodes 121 towards fixed actuation electrodes 111 for further preventing contact of movable actuation electrodes 121 with fixed actuation electrodes 111. In particular, for example, at least one standoff bump 130 can protrude from movable actuation electrodes 121 a distance that is substantially equal to the difference between the dimensions of the first gap and the second gap. Specifically, where the distance between fixed capacitive electrode 112 and movable capacitive electrode 122 when in an "open" state can be defined by a gap having a first dimension a, and the distance between fixed actuation electrodes 111 and movable actuation electrodes 121 when in the "open" state can be defined by a gap having a second dimension b that is larger than first dimension a, at least one standoff bump 130 can protrude from movable actuation electrodes 121 a distance equal to second dimension b minus first dimension a. In this arrangement, when movable component 120 is moved toward substrate 110 such that movable capacitive electrode 122 contacts fixed capacitive electrode 112, at least one standoff bump 130 can likewise contact fixed actuation electrodes 111, which can help to support movable component 120 above substrate 110 and minimize stress related to the attraction between fixed actuation electrodes 111 and movable actuation electrodes 121. Furthermore, gaps 123 can be formed due to the height difference between b and a. Such gaps 123 can improve device reliability by reducing actuator electric field under high voltage conditions, and the gap width can be designed to avoid significantly reducing self-actuation voltage.

Figure 3C:
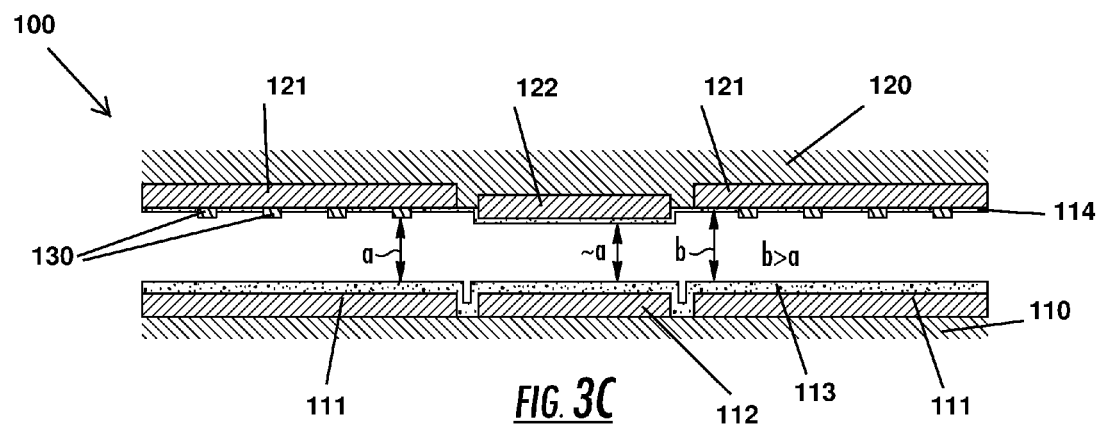
Figure 3D:
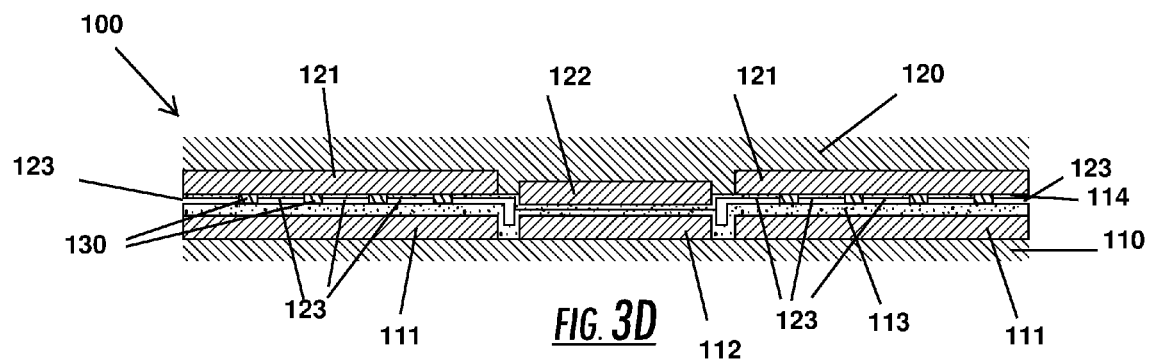

Furthermore, a dielectric layer 114 can be deposited on the movable component 120 as shown in FIGS. 3C and 3D. In this setup, fixed actuation electrode 111 and fixed capacitive electrode 112 can be deposited directly on top of the substrate 110 to reduce the gap space between the fixed and movable electrodes. In addition, a dielectric layer 113 can be deposited on top of the fixed electrodes 111, 112 in conformity to the existing surface topography. As such, standoff bumps 130 can be shorter in height yet gap spaces 123 can still be formed between the movable component 120 and the substrate 110, resulting in improved device reliability under high electric field conditions.

While FIGS. 3C-3F show dielectric layers on both movable beam and fixed electrodes, it is understood that the dielectric layer may be on either or both surfaces.

Alternatively, standoff bumps can be placed on top of the dielectric layer 113 and the fixed capacitive 111 and actuation 112 electrodes, as illustrated in FIG. 3E. According to another aspect shown in FIG. 3F, a layer of dielectric material 115 can be deposited before depositing the fixed capacitive electrode 112, therefore being placed at an elevated position compared to fixed actuation electrodes 111. As such, the gap distance a is further reduced compared to the gap distance b, resulting in larger gap spaces 123 when the device is in a "closed" position.

In some aspects, the movable component 120 can accommodate standoff bumps with at least two different sizes, as illustrated in FIGS. 3G and 3H. For example, standoff bumps 130 closer to the capacitive electrodes 112 and 122 can be smaller in height (e.g., 0.2 μm) with this height approximately equal to the gap difference, if present, and standoff bumps 131 closer to the support/anchor structures 124 can be taller in height (e.g. 0.5 μm). As demonstrated in FIG. 3H, the taller standoff bumps 131 can limit the deflection of the movable component 120, thus improving device stability and reliability. It should be noted that those having skill in the art should recognize that the standoff bumps can alternatively be conveniently placed on the fixed surface to achieve the same purpose.

Figure 4A:
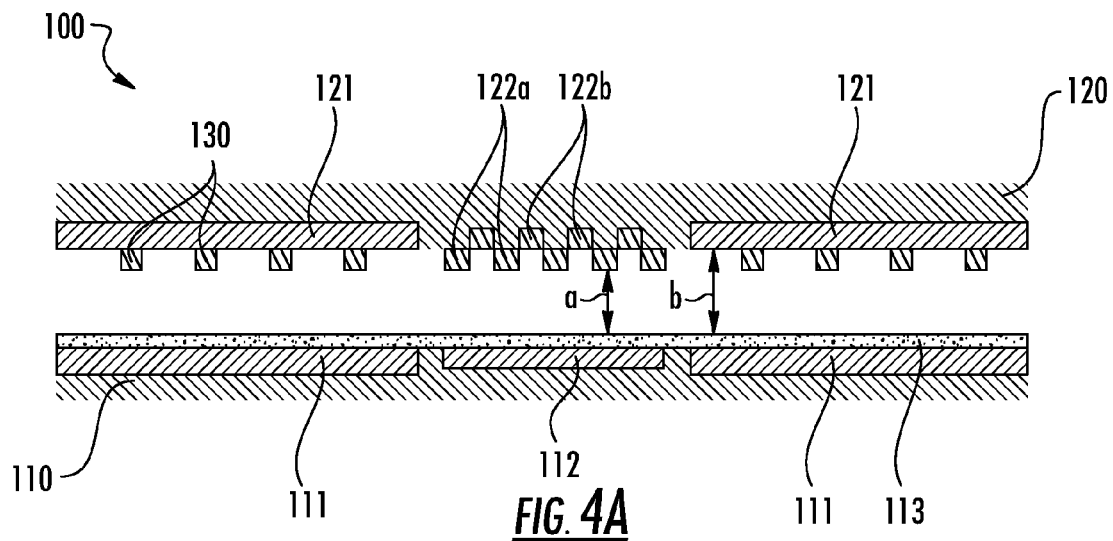
Figure 4B:
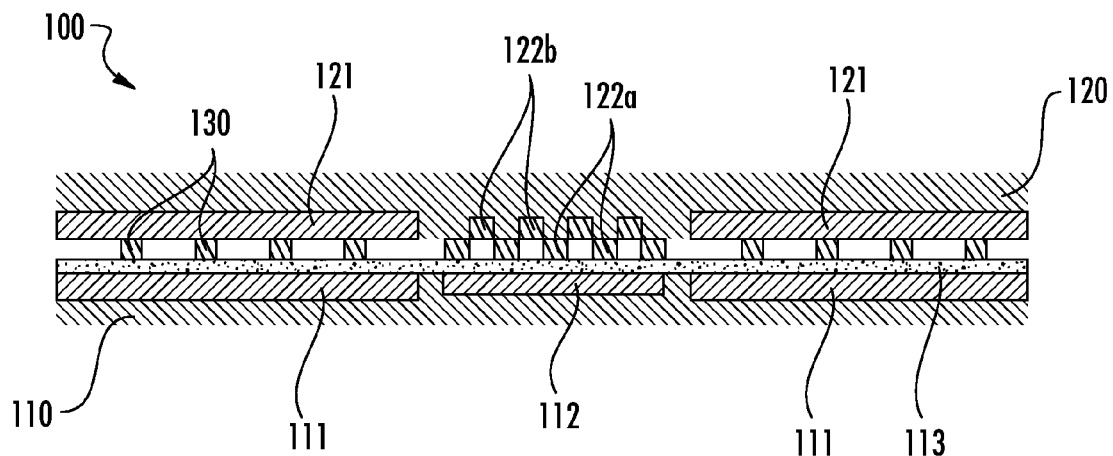

Furthermore, at least one standoff bump 130 can be formed in a manner substantially similar to the formation of a protruding movable capacitive electrode 122. Specifically, after positioning a sacrificial layer over substrate 110, one or more recesses corresponding to each of at least one standoff bump 130 can be formed in the sacrificial layer. It can be desirable to form at least one standoff bump 130 and the recess for the capacitor electrode using a single etch step into the sacrificial material. However, etch rates have a pattern dependence. As a result, etching cavities for both movable capacitive electrode 122 and at least one standoff bump 130 into the sacrificial layer can produce unequal depths if their geometries are too different in some processes. To address this issue, movable capacitive electrode 122 can be provided as an array of electrode portions that are substantially similar in size to at least one standoff bump 130. In particular, as shown in FIGS. 4a and 4b, for example, movable capacitive electrode 122 can be provided as one or more protruding capacitive portions 122a spaced apart from fixed capacitive electrode 112 by the first gap (i.e., having a first dimension a) and one or more recessed capacitive portions 122b spaced apart from fixed capacitive electrode 112 by a distance greater than the first gap (e.g., spaced by a second dimension b). As shown in FIGS. 4a and 4b, protruding capacitive portions 122a and recessed capacitive portions 122b can be provided in an alternating arrangement across movable component 120. In this way, even though the portions are arranged at different heights with respect to fixed capacitive electrode 112, all of the portions can together cover substantially the same footprint as a single electrode. Although this configuration can lower the maximum capacitance density, it can also improve manufacturability. For example, patterning protruding capacitive portions 122a each having a size that is substantially similar to a size of at least one standoff bump 130 can enable similar pattern factors and thus a depth into the sacrificial layer that is more closely matched to at least one standoff bump 130. As a result, the manufacture of variable capacitor 100 can be more consistent.

Alternatively, as shown in FIGS. 4C and 4D, metal thicknesses of the fixed actuation electrodes 111 and capacitive electrode 112 can be taller than their corresponding recesses, resulting in an uneven surface topography. As such, dielectric layer 113 deposited in conformity to the surface topography will have dips between the electrodes as illustrated in FIGS. 4C and 4D. In addition, movable actuation electrodes 121 and movable capacitive electrodes 122a and 122b can be formed from a single etch on the sacrificial layer. This way the depth between the electrodes can be more closely matched, resulting in a similar vertical dimension between the capacitor gap offset (b-a) and the standoff bumps 130. Such device structure can be desirable because the closed capacitor is then held flat, as shown in FIG. 4D, and can also improve device manufacturability.

Regardless of the particular configuration of elements, a common feature of each of the configurations discussed herein above is that movable capacitive electrode 122 is spaced apart from fixed capacitive electrode 112 by a first gap, and movable actuation electrodes 121 are spaced apart from fixed actuation electrodes 111 by a second gap that is larger than the first gap. The particular gap sizes can be specifically selected to address any of a variety of performance criteria. For example, the difference between the size of the first gap (i.e., first dimension a) and the size of the second gap (i.e., second dimension b) can be designed to be large enough to reduce the electric field generated between fixed actuator electrodes 111 and movable actuator electrodes 121, which can provide for high reliability. At the same time, the difference between the gap sizes can be selected to be small enough to avoid significantly reducing self-actuation voltage. Accordingly, the difference between the dimensions of the first gap and the second gap measured in microns can be selected to be greater than a value of a ratio between an actuation voltage $V_{actuation}$ (e.g., between about 10 and 100V) and a maximum electric field $E_{max}$ generated between movable actuation electrodes 121 and fixed actuation electrodes 111 (e.g., between about 100 and 1000 V/μm). Furthermore, the difference between the dimensions of the first gap and the second gap can be selected such that a self-actuation voltage between movable actuation electrodes 121 and fixed actuation electrodes 111 is above a predetermined threshold value. For example, the difference between the dimensions of the first gap and the second gap can be less than or equal to one quarter of the dimension of the second gap. In particular exemplary configurations, for instance, the difference between the dimensions of the first gap and the second gap can be between about 10 nm and 500 nm.

Figure 5A:
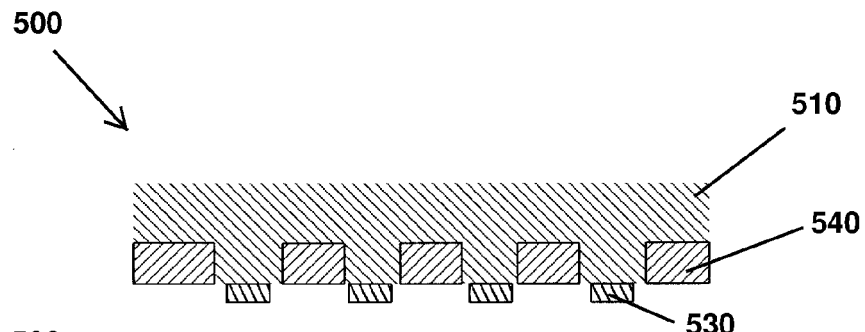
FIGS. 5A to 5E are cross sectional views of standoff bumps located in movable actuation regions of a MEMS device according to an embodiment of the presently disclosed subject matter.

FIG. 5A illustrates a cross sectional view of standoff bumps 530 located in the movable actuation region of a MEMS device, generally designated 500. The bumps 530 can be square, round, octagonal or any general shape that can be formed in a mask. In some aspects, the standoff bumps 530 can be in contact with a dielectric layer 510, and isolated from the actuation metals 540. The standoff bumps 530 can be dielectric in nature (e.g., oxide material) and deposited into dips of a sacrificial layer. A planarization process can be performed to provide a even surface, and actuation metal 540 can be then deposited on top of the sacrificial layer. The actuation metal 540 is patterned to remove it from above the standoff bumps. The dielectric layer 510 can then be deposited between the actuation metal 540 and onto the standoff bumps 530. In some aspects, the dielectric layer 540 can be a same type of material as the standoff bumps 530 (e.g., oxide material).

Figure 5B:
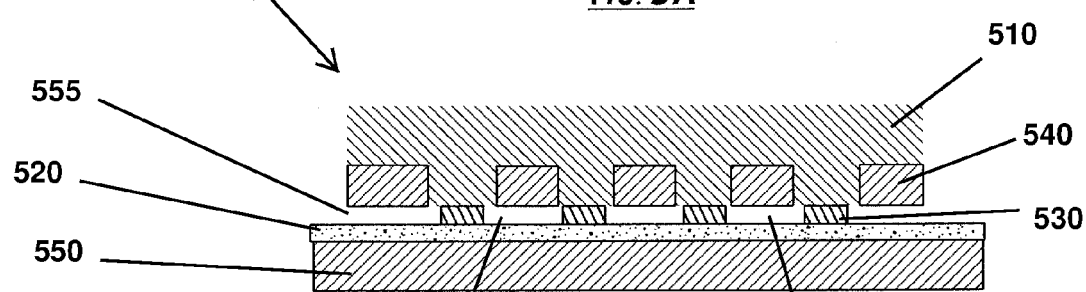

FIG. 5B illustrates the MEMS device in a "closed" position, where the standoff bumps 530 lays flat on a fixed dielectric surface 550. The fixed dielectric surface 550 can rest on top of a substrate 520, and the gap spaces 555 between the actuation metal 540 and dielectric layer 550 can reduce actuator electric field under high voltage conditions and improve device reliability. The actuator metal 540 absent above the standoff bumps 530 also greatly reduces the electric fields within the bumps and nearby dielectric layers.

Figure 5C:
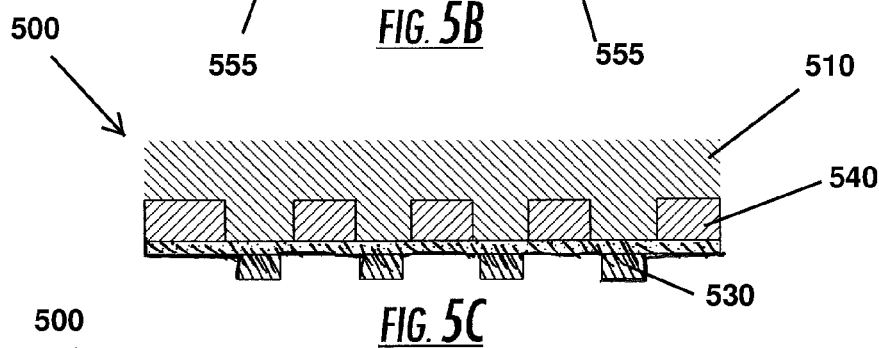
Figure 5D:
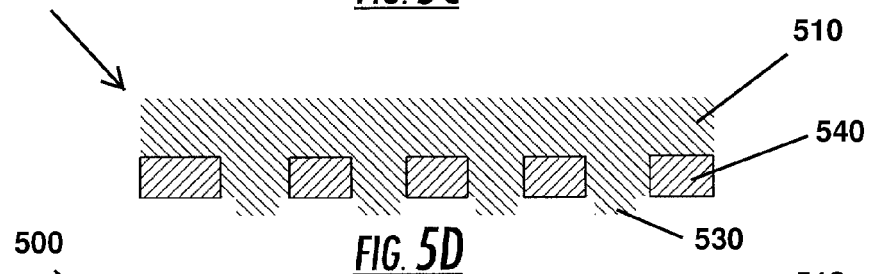

Alternatively, recesses can be etched into the sacrificial layer, and standoff bumps 530 can be formed by depositing dielectric material (e.g., oxide material) into the recesses, as illustrated in FIG. 5C. Additional dielectric layer 510 can be deposited on top of the standoff bumps 530 between the actuation metal. In some other aspects, actuation metal 540 can be deposited and recesses can be etched between the metals. Standoff bumps 530 can be formed by a single deposition of dielectric material into the recesses and between the metals, as illustrated in FIG. 5D.

Figure 5E:
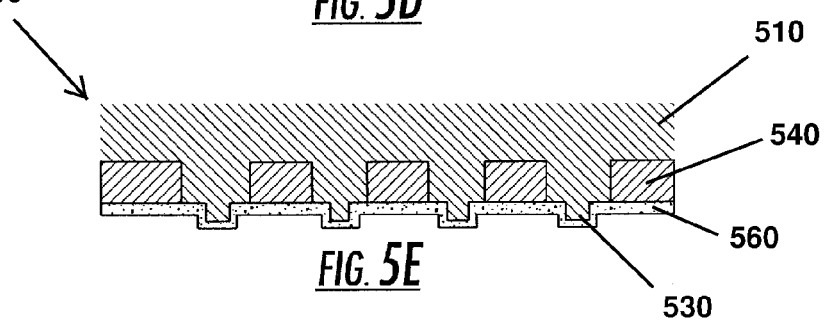

In some aspects, recesses can be first etched into the sacrificial layer, and a layer of dielectric material 560 can be deposited to cover the entire surface including the recesses. Actuation metal 540 can be deposited between the recesses, followed by a deposition of dielectric material layer 510 between the metals 540, as illustrated in FIG. 5E.

Figure 5F:
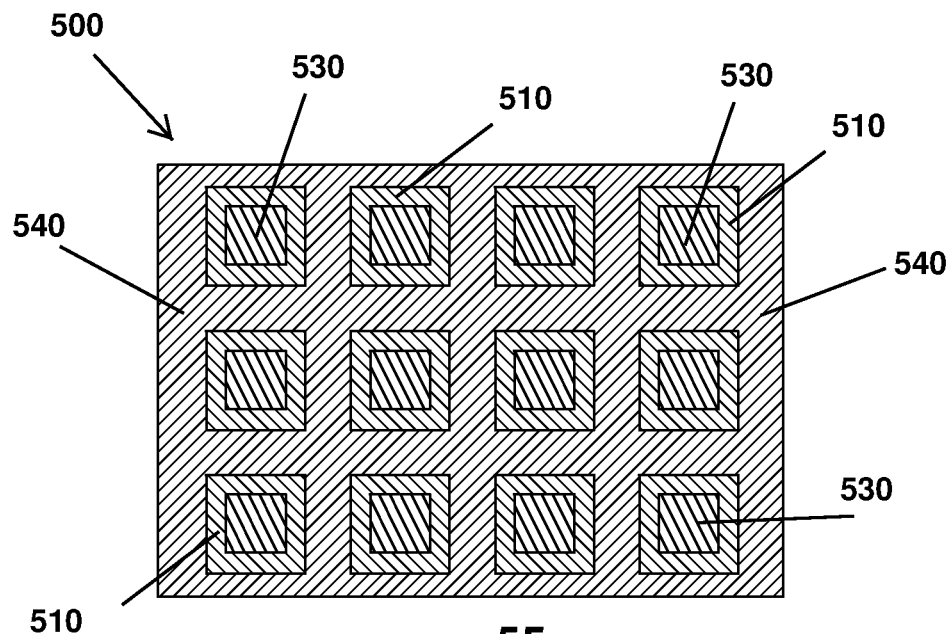
FIGS. 5F and 5G are side views illustrating standoff bumps as they are placed in movable actuation regions of a MEMS device according to an embodiment of the presently disclosed subject matter.
Figure 5G:
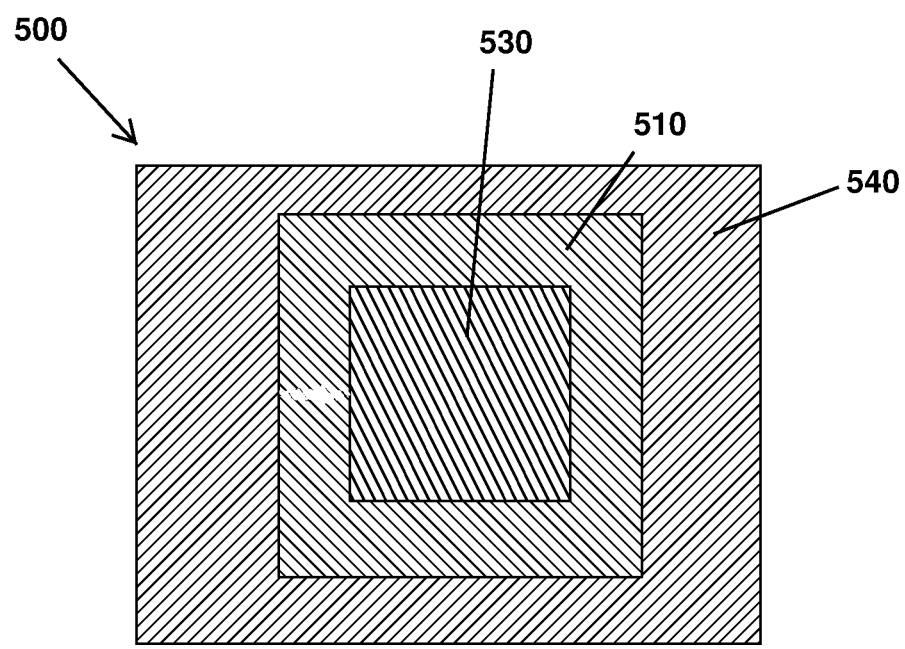

FIGS. 5F and 5G are side views illustrating of standoff bumps 530 in the actuation electrode region as they are placed on the bottom surface of the movable component of the MEMS device 500 Standoff bumps 530 can be square, round, octagonal or any general shape that can be formed in a mask. As shown in FIGS. 5F and 5G, standoff bumps 530 may be arranged in a pattern which may be evenly spaced as shown, unevenly spaced or may be in other arrangements such as hexagonally packed. Surrounding the bumps 530 are another layer of dielectric material 540, and actuation metals 540 are electrically isolated from the standoff bumps 530. In some aspects, the standoff bumps 530 can be 50 nm to 1.0 μm in height and 0.1 μm to 5 μm in diameter. The actuation metal thicknesses range from 0.1 μm to 0.5 μm. The lateral gap between the edge of the bump and the patterned edge of the surrounding actuator metal should be as large or larger than the height of the standoff bump.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for manufacturing a micro-electro-mechanical system (MEMS) variable capacitor, the method comprising:
    depositing a fixed actuation electrode on a substrate;
    depositing a fixed capacitive electrode on the substrate;
    depositing a sacrificial layer over the fixed actuation electrode and the fixed capacitive electrode;
    etching the sacrificial layer to form a recess in a region of the sacrificial layer above the fixed capacitive electrode;
    depositing a movable actuation electrode on the sacrificial layer above the fixed actuation electrode;
    depositing a movable capacitive electrode in the recess of the sacrificial layer above the fixed capacitive electrode;
    depositing a structural material layer on the movable actuation electrode and the movable capacitive electrode; and
    removing the sacrificial layer such that the movable actuation electrode, the movable capacitive electrode, and the structural material layer define a movable component suspended above the substrate and movable with respect to the fixed actuation electrode and the fixed capacitive electrode;
    wherein at least a portion of the movable capacitive electrode is spaced apart from the fixed capacitive electrode by a first gap;
    wherein the movable actuation electrode is spaced apart from the fixed actuation electrode by a second gap that is larger than the first gap; and
    wherein a difference between a dimension of the first gap and a dimension of the second gap is less than or equal to one quarter of the dimension of the second gap.

2. The method of claim 1, wherein the difference between the dimension of the first gap and the dimension of the second gap is between 10 nm and 500 nm.

3. The method of claim 1, comprising depositing a layer of dielectric material on the substrate prior to depositing a fixed capacitive electrode such that the fixed capacitive electrode is elevated relative to the fixed actuation electrode.

4. The method of claim 1, comprising:
    further etching the sacrificial layer further to form one or more recesses above the fixed actuation electrode; and
    depositing one or more standoff bump in the one or more recesses above the fixed actuation electrode;
    wherein the at least one standoff bump extends between the fixed actuation electrode and the movable actuation electrode a distance that is substantially equal to the difference between the dimension of the first gap and the dimension of the second gap.

5. The method of claim 4, wherein depositing one or more standoff bump comprises depositing a layer of dielectric material over the sacrificial layer, including in the one or more recesses above the fixed actuation electrode.

* * * * *